United States Patent
Nguyen

(10) Patent No.: US 7,193,337 B2
(45) Date of Patent: Mar. 20, 2007

(54) SYSTEM AND METHOD UTILIZING A SOLID STATE POWER CONTROLLER (SSPC) FOR CONTROLLING AN ELECTRICAL LOAD OF A VARIABLE FREQUENCY THREE-PHASE POWER SOURCE

(75) Inventor: That Nguyen, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 483 days.

(21) Appl. No.: 10/658,044

(22) Filed: Sep. 9, 2003

(65) Prior Publication Data

US 2005/0052808 A1    Mar. 10, 2005

(51) Int. Cl.
*H01H 35/00* (2006.01)
(52) U.S. Cl. .................. 307/130; 324/86; 323/235; 327/451; 327/452
(58) Field of Classification Search ............... 307/130; 324/86; 323/235; 327/451, 452
See application file for complete search history.

(56) References Cited

U.S. PATENT DOCUMENTS

| | | | |
|---|---|---|---|
| 4,106,007 A | 8/1978 | Johnston et al. | |
| 4,117,364 A | 9/1978 | Baker | |
| 4,295,189 A | 10/1981 | Boys | |
| 4,538,220 A | 8/1985 | Gyugyi | |
| 4,570,214 A | 2/1986 | Tanaka | |
| 4,626,698 A | 12/1986 | Harnden, Jr. et al. | |
| 4,672,301 A * | 6/1987 | Westfall et al. | 323/243 |
| 4,713,744 A * | 12/1987 | Coston | 363/160 |
| 4,901,005 A * | 2/1990 | Shin et al. | 324/86 |
| 5,045,988 A * | 9/1991 | Gritter et al. | 363/35 |
| 5,144,209 A * | 9/1992 | Inaji et al. | 318/254 |
| 5,181,159 A | 1/1993 | Peterson et al. | |
| 5,752,047 A | 5/1998 | Darty et al. | |
| 6,181,092 B1 * | 1/2001 | Turner | 318/254 |

(Continued)

FOREIGN PATENT DOCUMENTS

JP    10-228987 A    8/1988

OTHER PUBLICATIONS

Patent Abstracts of Japan, vol. 008, No. 213 (E-269), Sep. 28, 1984 (Sep. 28, 1984).

(Continued)

*Primary Examiner*—Brian Sircus
*Assistant Examiner*—Daniel Cavallari
(74) *Attorney, Agent, or Firm*—Birch, Stewart, Kolasch & Birch, LLP

(57) ABSTRACT

A solid state power controller (SSPC) (100) includes a power switching controller (30) and power switching devices (PSDs) (20A, 20B, 20C) for controlling each phase of a multiple-phase load to switch-on or -off at a zero-crossing point of a corresponding phase of a multiple-phase power source. The power switching controller (30) may include an ASIC (25A, 25B, 25C) for controlling each PSD (20A, 20B, 20C) to switch the corresponding load phase on or off. The ASIC (25A, 25B, 25C) may be configured to control the PSD (20A, 20B, 20C) to switch-on the load phase at a detected zero-crossing point of the voltage supplied by the corresponding phase of the power source, and to switch-off the load phase at a detected zero-crossing point of the load current supplied by the corresponding phase of the power source.

22 Claims, 7 Drawing Sheets

U.S. PATENT DOCUMENTS 6,317,356 B1 * 11/2001 Hoffmann et al. .......... 365/145
6,373,336 B1    4/2002 Anderskouv et al.
2002/0074863 A1 6/2002 Turvey
2003/0112640 A1 * 6/2003 Briesen et al. ................ 363/13
2004/0051494 A1 * 3/2004 Messersmith ............... 318/729
2004/0251910 A1 * 12/2004 Smith ......................... 324/510

OTHER PUBLICATIONS

Patent Abstracts of Japan, vol. 005, No. 192 (E-085), Dec. 8, 1981 (Dec. 08, 1981).

* cited by examiner

SYSTEM AND METHOD UTILIZING A SOLID STATE POWER CONTROLLER (SSPC) FOR CONTROLLING AN ELECTRICAL LOAD OF A VARIABLE FREQUENCY THREE-PHASE POWER SOURCE

FIELD OF THE INVENTION

The present invention relates to power control for electrical loads of variable frequency three-phase power sources utilizing solid state power controllers (SSPCs).

BACKGROUND OF THE INVENTION

Conventional mechanical and electro-mechanical power switches suffer from disadvantages including high levels of noise and spike voltages generated when an electrical load is switched on. To overcome these problems, a solid state power controller (SSPC) may be utilized, which includes a solid state switching device, e.g., a power MOSFET switch. Such SSPCs also have the advantages of occupying less space and being light-weight.

In an electrical system with a variable frequency AC power source, it is desirable to switch-on the loads (e.g., single-phase and three-phase loads) at zero-crossing points of the waveform of the voltage generated by the power source. This reduces the harmonics that are produced when the loads are turned on, and minimizes electromagnetic interference (EMI) effects. It is also advantageous to switch-off such loads at the zero-crossing points of the current supplied by the power source, in order to reduce the effects of EMI and thermal stress on the switching devices and load equipment.

SUMMARY OF THE INVENTION

Exemplary embodiments of the present invention include a solid state power control (SSPC) device that controls a multiple-phase electrical load of a multiple-phase voltage source, which includes a power switching device (PSD) that switches each phase of the electrical load on or off at a zero-crossing point of a corresponding phase of the power source.

According to an exemplary embodiment, the SSPC device includes zero-crossing detectors operably connected to the PSDs. Each zero-crossing detector may be configured to receive a waveform corresponding to a phase of the power source, and to convert the received waveform into a digital pulse waveform whose rising and falling edges occur at zero-crossing points for the phase. The rising edges of these digital pulse waveforms may act as triggering signals for a power switching controller in the SSPC device. Accordingly, when the power switching controller receives a command signal to turn the electrical load on or off, the power switching controller may be triggered by these triggering signals to control the PSDs to switch on or off the corresponding load phases.

According to an exemplary embodiment of the present invention, the SSPC device is configured to invert the digital pulse waveform of the third phase of the power source in order to ensure that the rising edges, i.e., triggering signals, for each of the three phases occur within one-half cycle of one another.

In another exemplary embodiment, the SSPC device may include a fail-safe device in the power switching controller that is configured to switch any of the phases on or off at an arbitrary time when the triggering signal of the corresponding phase is not received by the PSD. According to an exemplary embodiment, the fail-safe device may wait at least one-half (½) of the phase cycle time before arbitrarily turning on or off the phase.

According to exemplary embodiments of the present invention, the SSPC device is configured to control each phase of a three-phase electrical load to switch on at a zero-crossing point of a corresponding phase of the voltage supplied by a three-phase power source. In other exemplary embodiments, the SSPC device may be configured to control each phase of the electrical load to switch off at a zero-crossing point of a corresponding phase of the current supplied to the load by the power source.

By utilizing the digital pause waveforms as zero-crossing detection signals for the phases of a multiple-phase power source (e.g., three-phase source), exemplary embodiments of the present invention provide power switching for the corresponding phases of an electrical load without dependence on the frequency or phase-shift among the phases of the power source. Thus, exemplary embodiments of the present invention may be used for controlling the electrical loads of multiple-phase power sources of various frequencies.

Further advantages and scope of applicability of the present invention will become apparent from the detailed description provided hereinafter. However, it should be understood that the detailed description and specific embodiments therein, while disclosing exemplary embodiments of the invention, are provided by way of illustration only.

BRIEF DESCRIPTION OF THE DRAWINGS

A more complete understanding of the present invention will become apparent from the following description taken in conjunction with the accompanying drawings, wherein.

DETAILED DESCRIPTION OF EXEMPLARY EMBODIMENTS

Figure 1:
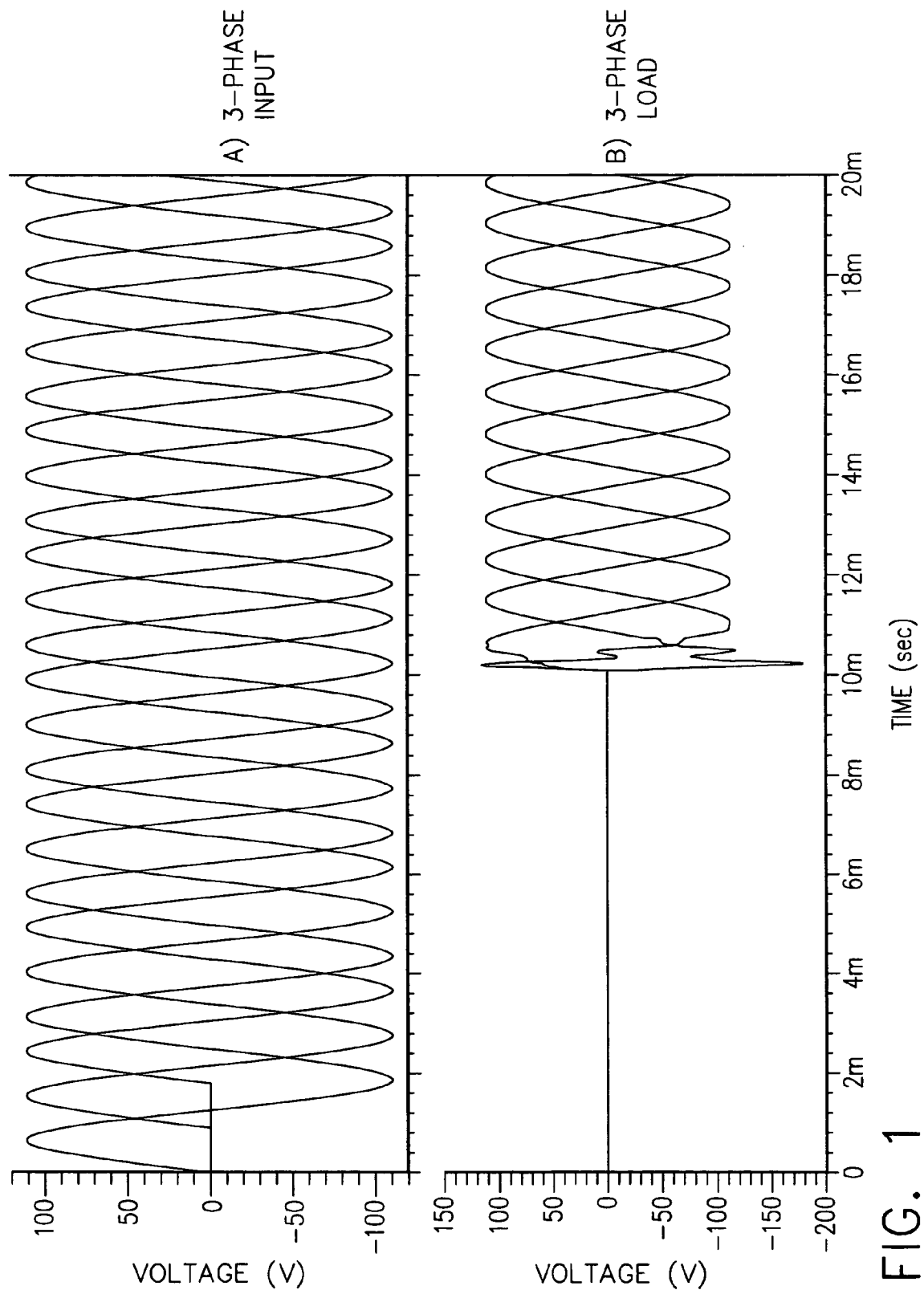
FIG. 1 illustrates the effects of switching on the phases of a three-phase electrical load at arbitrary points with respect to a three-phase power source.

Exemplary embodiments of the present invention are disclosed in the following description.

A solid state power controller (SSPC) is generally a circuit card assembly that contains one or more solid state power switching devices and a power switching controller. The power switching controller may, for instance, include multiple Application Specific Integrated Circuits (ASICs). In AC electrical systems, an SSPC may be used to distribute AC power to various electrical loads and to protect the wiring in the system from overcurrent conditions. The SSPC may be modular in design so that it can be applied to many applications.

A power switching device (PSD) of an SSPC provides line power switching to thereby turn an electrical load on or off. The PSD is controlled by the power switching controller of the SSPC. According to an exemplary embodiment, the PSD may utilize power MOSFET technology to minimize power dissipation.

The power switching controller of an SSPC incorporates load switching and protective functions. These functions are enabled by related "logic" which refers to any combination of hardware, software, and/or combinations of hardware and software to implement the associated function, as will be appreciated by those skilled in the art.

According to an exemplary embodiment, the protective functions of a power switching controller may include monitoring the heating conditions of a PSD and ensuring that the thermal limits of certain components and wiring in the system is not exceeded. For example, the power switching controller may include logic for monitoring the substrate temperature and/or load current for a corresponding PSD, and shut-down logic for opening the switching device when either the temperature or load current exceeds a predetermined threshold.

According to an exemplary embodiment, the load switching functions of the power switching controller includes controlling the timing at which a corresponding PSD switches its load on or off. For example, the power switching controller may control the PSD to turn a load on or off in response to a received command signal. Such command signals may be sent by a micro-controller, which controls the distribution of power in the electrical system.

According to an exemplary embodiment of the present invention, the load switching logic of the power switching controller is operable to control a particular PSD to switch-on or -off a connected load at zero-crossing points when the PSD is operating in AC mode. For instance, when an electrical load is to be turned on, the power switching controller may control the corresponding PSD to switch the load on at a detected zero-crossing point of the voltage waveform supplied by the power source. When the load is to be turned off, the power switching controller may control the PSD to switch the load off at a detected zero-crossing point of the waveform of the current supplied by the power source (i.e., the load current of the PSD).

In an exemplary embodiment, the SSPC may include a power switching controller connected to multiple PSDs in order to control a multiple-phase power source. For example, such an SSPC may be configured to control a three-phase power source. In such a configuration, the SSPC may include three PSDs in order to control a three-phase load (each PSD controlling a corresponding phase), and the power switching controller of the SSPC may include three ASICs that are gang-operated such that each ASIC controls a corresponding one of the PSDs. Thus, each of the three phases of the load may be controlled in a coordinated manner.

In the situation where an SSPC is controlling a three-phase load, or other multiple-phase load, it would be advantageous for the PSDs to switch each of the load phases on/off at a zero-crossing point.

FIG. 1 illustrates the effects of switching the phases of the three-phase electrical load on without regard to the zero-crossing points of the voltage waveform A) supplied by a three-phase power source. Waveform B) illustrates the three load phases, which are all turned on at an arbitrary point. Particularly, waveform B) shows the voltage harmonics and noise that can be generated as each phase of the load is switched on.

Figure 2:
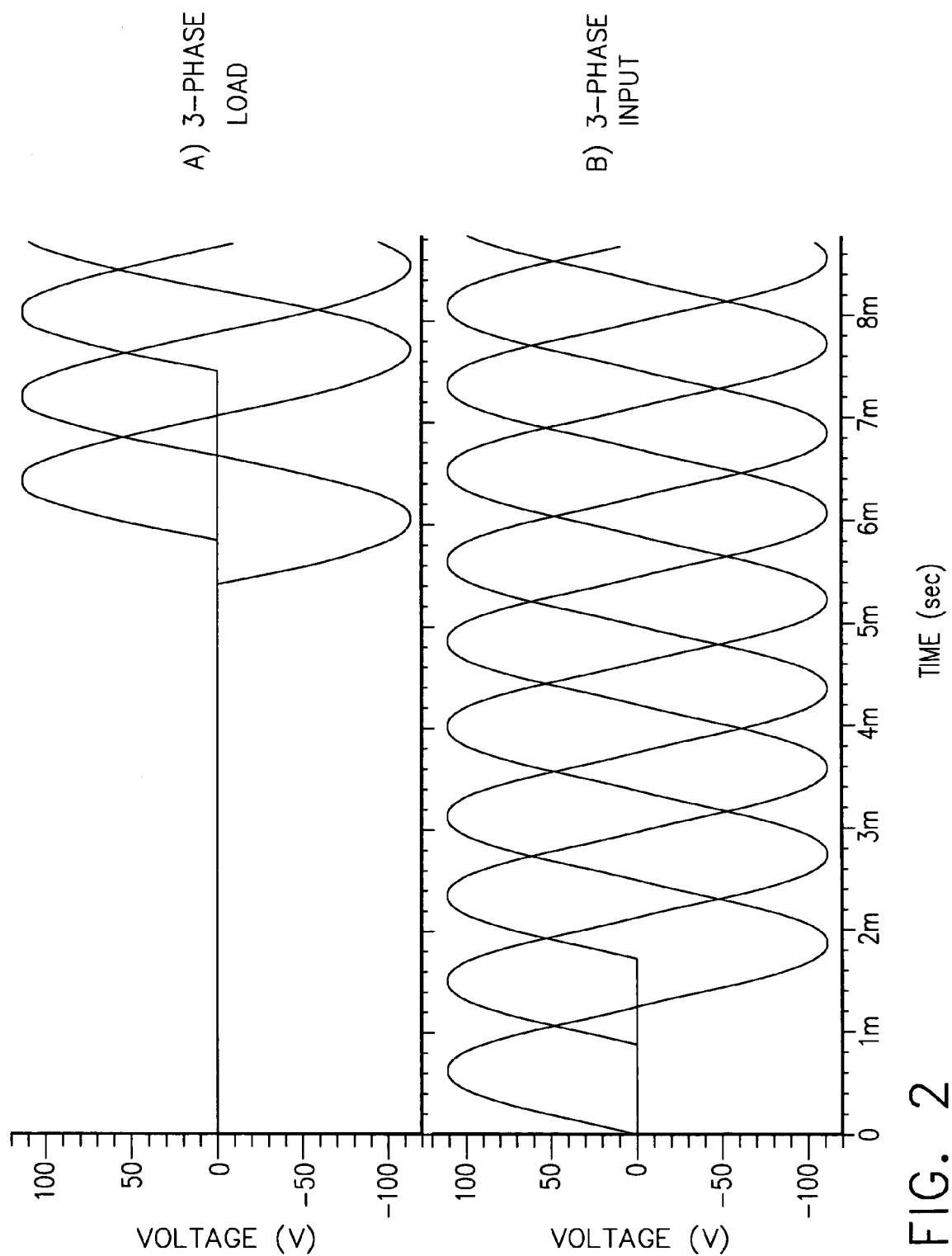
FIG. 2 illustrates an instance where each phase of a three-phase load is switched on at a detected zero-crossing point of a corresponding phase of a three-phase power source in accordance with an exemplary embodiment of the present invention.

Conversely, FIG. 2 illustrates an instance where each phase of a three-phase load, as illustrated by waveform A), is turned on at a zero-crossing point of the corresponding phase in the voltage supplied by the three-phase power source. In FIG. 2, waveform B) illustrates the voltage waveform of the power source. Specifically, waveform A) shows that the noise and harmonics of each phase of the load are significantly reduced when the phases are switched-on at a zero-crossing point.

In order to reduce the thermal stress on the components and the wiring of the PSDs and load circuitry, it is also advantageous to turn off each phase of a multiple-phase load at a zero-crossing point of the corresponding phase of the current supplied by the power source. For instance, the PSD associated with a particular phase may include a shunt resistor, from which the load current (supplied by the particular phase of the power source) can be measured. To reduce the risk of overcurrent, the PSD may be controlled to turn the connected phase of the electrical load off at a zero-crossing point of the measured current.

According to an exemplary embodiment, each ASIC in the power switching controller may include logic for performing zero-crossing voltage detection and zero-crossing current detection. To ensure proper control of the multiple-phase load, the ASICs may also include fail-safe mechanisms for ensuring that each phase of the electrical load is switched-on/-off in case the zero-crossing detection signal corresponding to that phase is disabled. The fail-safe mechanism will be described in greater detail below.

According to an exemplary embodiment, the zero-crossing detection logic utilized in the power switching controller may generate triggering signals comprised of digital pulse (square) waveforms.

For example, the zero-crossing voltage detection in each ASIC may generate a triggering signal that represents a square waveform in-phase with the corresponding phase of the AC voltage generated by the power source. Such a triggering signal follows the period and phase of the corresponding voltage phase of the power source, regardless of whether this voltage has a constant or variable frequency.

Figure 3:
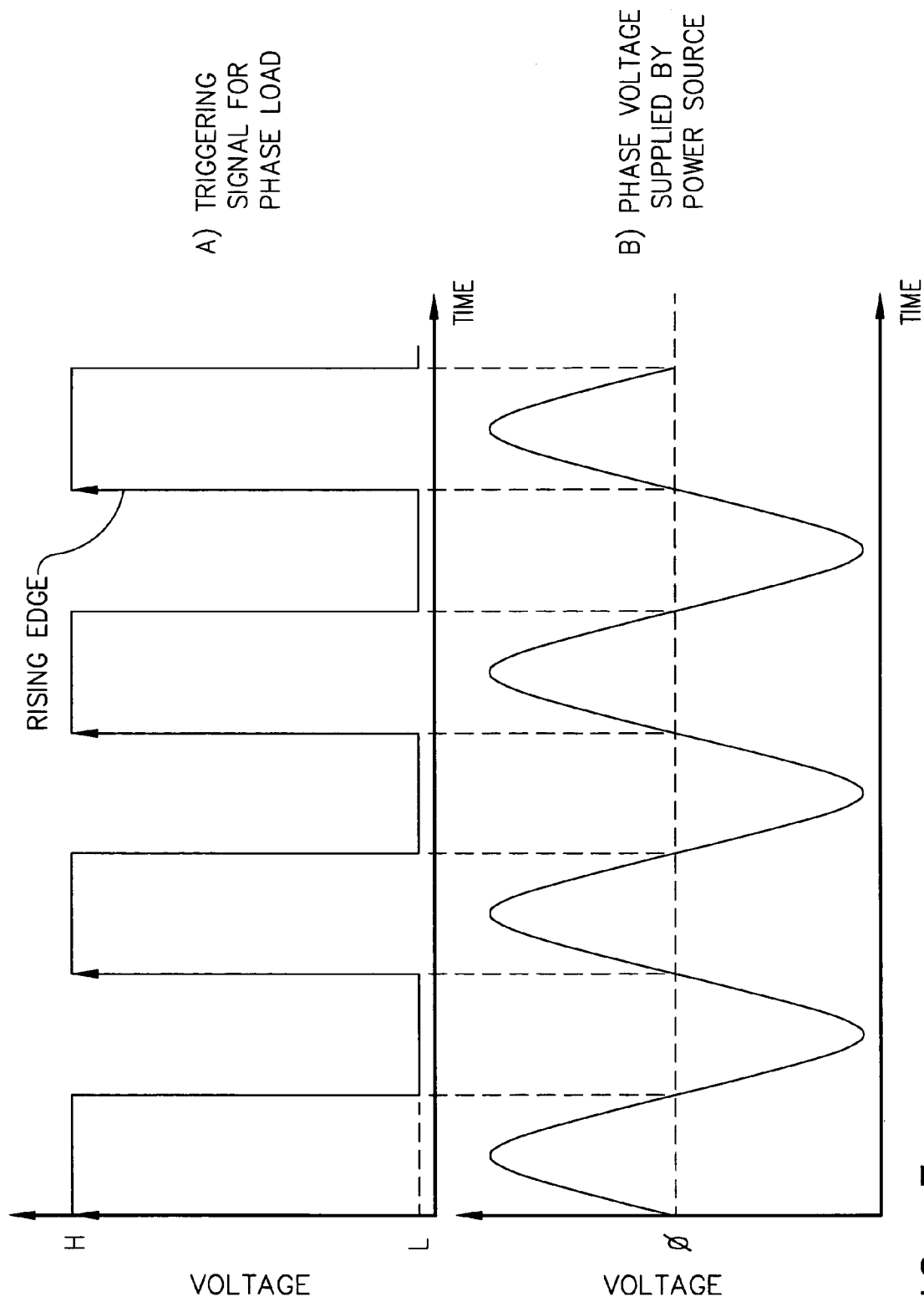
FIG. 3 illustrates a triggering signal for a particular phase of a three-phase load, which is generated based on the detected zero-crossing points of a corresponding phase in a three-phase power source, in accordance with an exemplary embodiment of the present invention.

FIG. 3 illustrates the triggering signal generated by the zero-crossing voltage detection logic of an ASIC in response to a voltage phase supplied by the power source. Each pulse in the triggering signal of FIG. 3 includes a rising edge. Any of these rising edges may be used for triggering logic within the ASIC, for instance, to activate a PSD to turn on a corresponding phase load.

The zero-crossing current detection logic of the ASIC may similarly output a triggering signal, as illustrated by FIG. 3, by generating a digital pulse waveform based on a load current supplied by the power source.

As discussed above, the power switching controller of an SSPC may include logic to protect the PSDs and load equipment from overheating and/or overcurrent conditions. For example, the power switching controller may include mechanisms for automatically switching off all of the phases of the electrical load when a measured temperature or current is too high. It is important that each load phase be turned off as quickly as possible during such situations.

However, if an overheating or overcurrent condition occurs after one while the phases of the load are turning on, these protective mechanisms must wait until all of the phases of the load have been switched-on before any of them can be switched-off. When this situation arises, the risk of damage is significant if the gap between turn-on times for the respective load phases is large. Specifically, damage may occur to the PSD(s) and load equipment of the phase(s) already switched-on, while the last phase is waiting to be turned on.

To reduce these risks, the load should be controlled so that each phase will be turned on within a certain time limit. Thus, according to an exemplary embodiment, the power switching controller is designed to cause each phase of a multiple-phase load to be turned on within a predetermined time of one another, for example within one-half cycle of one other. In other words, exemplary embodiments of the present invention should switch-on the last load phase within ½ cycle of the first.

However, for a three-phase power source in which the phases (0, 240°) are 120° apart, the rising edges of the above-described triggering signals (digital pulse waveforms) for the first and third phases do not occur within one-half cycle of each other. To remedy this, the triggering signal corresponding to the third phase is inverted according to an exemplary embodiment.

Figure 4:
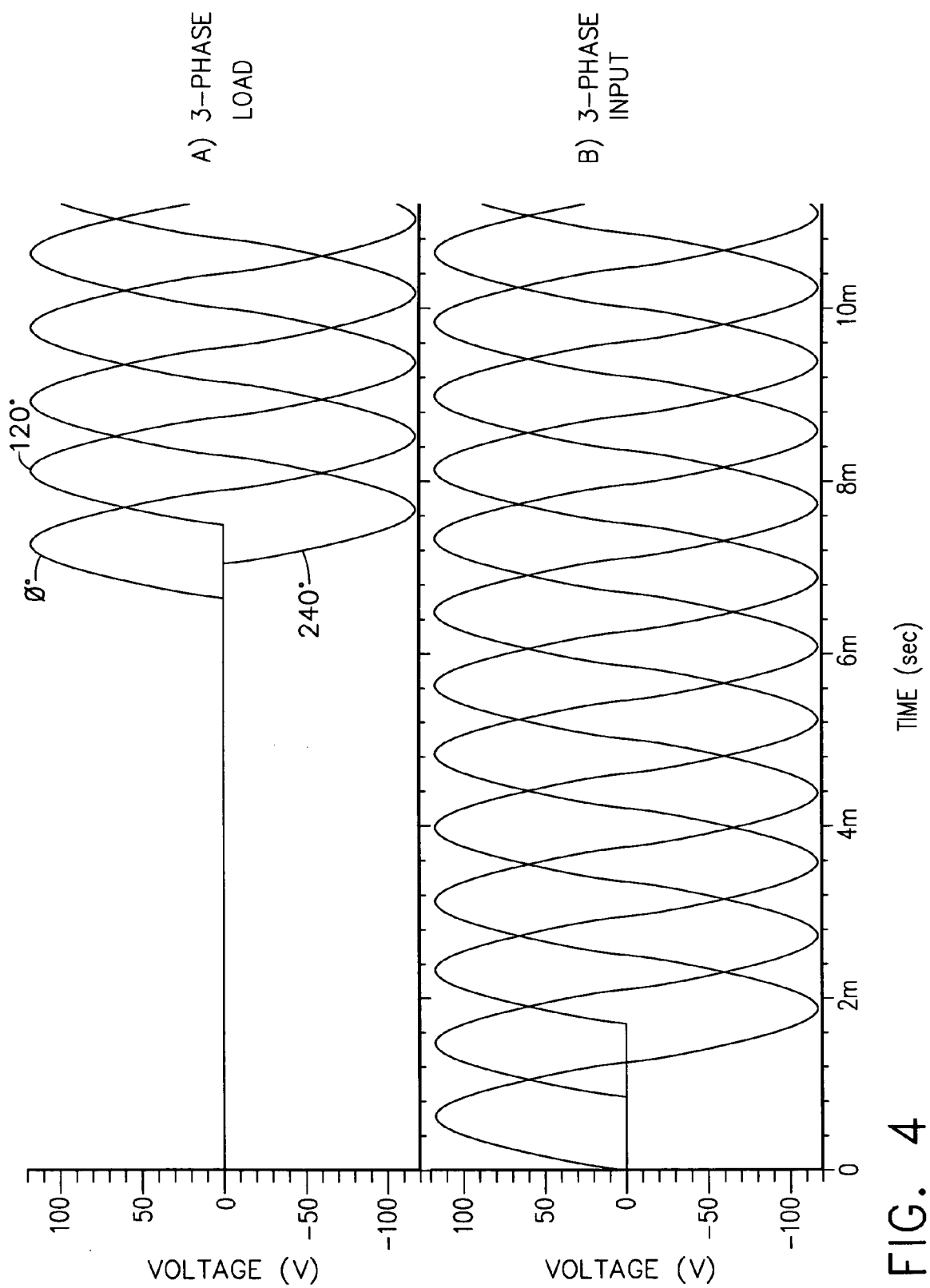
FIG. 4 illustrates the phases of a three-phase load being switched-on at zero-crossing points in an instance where a triggering signal for the third phase is inverted, in accordance with an exemplary embodiment of the present invention.

FIG. 4 illustrates the effects of inverting the triggering signal for the third phase on the corresponding load. As shown in FIG. 4, the third phase (240°) of the three-phase load is switched on at a point where the corresponding voltage phase of the three-phase power source crosses zero toward a negative amplitude, while the first two phases of the load (0°, 120°) are switched on at the points at which the corresponding voltage phases of the power source cross zero to a positive amplitude. Accordingly, each phase of the load is turned on within one-half cycle of one another.

Figure 5:
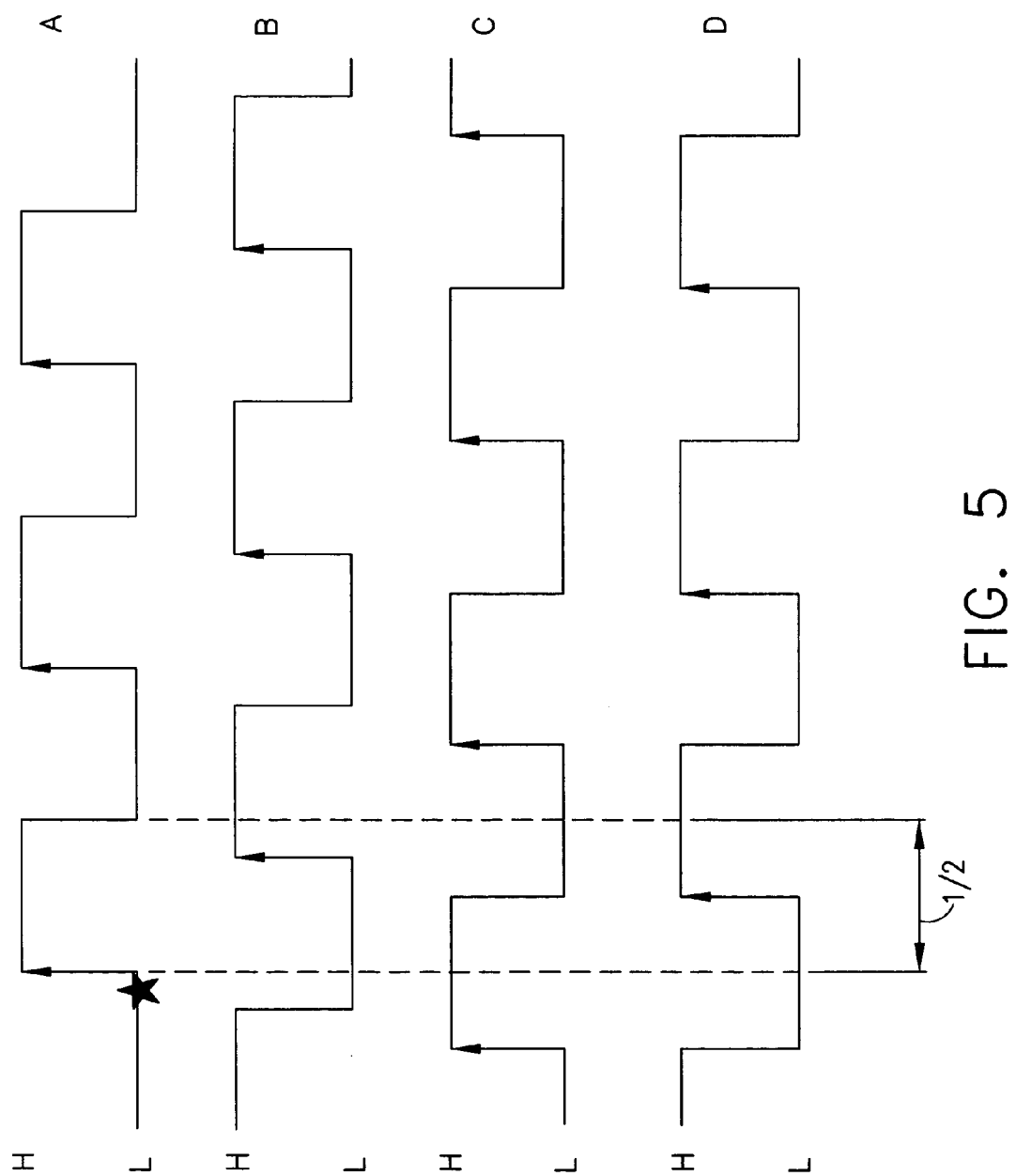
FIG. 5 illustrates the triggering signals for switching-on or -off each phase of a three-phase load, in which the third triggering signal is inverted to ensure that the three phases of the load are switched on or off within one-half cycle of one another, in accordance with an exemplary embodiment of the present invention.

FIG. 5 illustrates the pulse-type triggering signals generated for each phase of a three-phase load, in which the triggering signal for the third phase is inverted. In FIG. 5, the digital pulse waveforms A) and B) illustrate the triggering signals of the first and second load phases, respectively. Digital pulse waveform C) represents a non-inverted triggering signal generated by zero-crossing detection logic for the third pulse of the electrical load, while digital pulse waveform D) represents the inverted triggering signal generated for the third phase.

Referring to FIG. 5, after a command signal is received to switch-on the three-phase load (indicated by the star), FIG. 5 shows that inverting the triggering signal for the third phase will ensure that the rising edges of the triggering signals for the three load phases will occur within one-half cycle of each other.

According to an exemplary embodiment, the ASICs corresponding to each phase may be configured to invert the triggering signals generated by both the voltage and current zero-crossing detection logic, to ensure that the load phases are switched-on and -off within ½ cycle of one another. In an alternative exemplary embodiment, only the triggering signal of the voltage zero-crossing detection is inverted.

As described above, each ASIC may also be configured to include fail-safe logic to ensure that each phase of the load is switched-on/-off, even in cases where the corresponding triggering signal, i.e., the digital pulse waveform of the voltage/current detection circuit, becomes disabled.

The fail-safe mechanism of each ASIC may include logic that waits a predetermined time (e.g., at least ½ cycle of the phase) after receiving the command signal to see if a rising edge of the digital pulse waveform is generated. If no rising edge is generated within the predetermined time, the ASIC may be triggered by the fail-safe logic to control the PSD to switch the corresponding phase of the load on/off at an arbitrary point.

Figure 6:
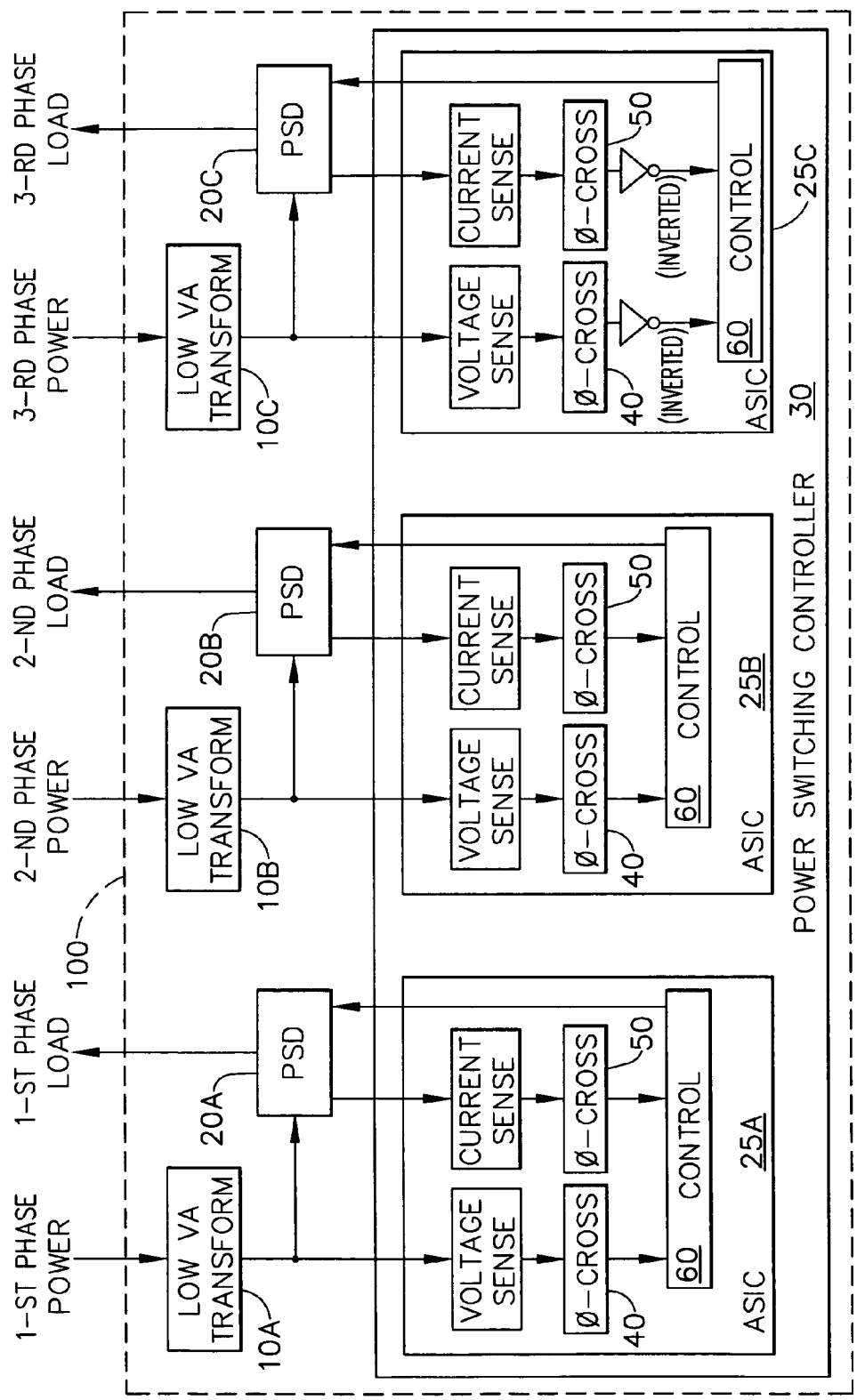
FIG. 6 illustrates a block diagram of a solid state power controller (SSPC) in accordance with an exemplary embodiment of the present invention.

FIG. 6 illustrates a block diagram of an SSPC 100 configured to control a multiple-phase electrical load of a multiple-phase power source. In particular, FIG. 6 illustrates an exemplary embodiment of an SSPC 100 for use in an AC electrical system to control a three-phase load of a three-phase power source.

In FIG. 6, each of the first phase, second phase, and third phase of the power source is fed into a respective low VA transformer 10A, 10B, 10C. Each low VA transformer 10A, 10B, 10C is operably connected to a PSD 20A, 20B, 20C and an ASIC 25A, 25B, 25C, respectively. Each ASIC 25A, 25B, 25C is operably connected to the respective PSD 20A, 20B, 20C to control the corresponding phase of the load.

In particular, each ASIC 25A, 25B, 25C includes logic for processing the line voltage output from the connected low VA transformer 10A, 10B, 10C, and outputting a sensed voltage waveform to a voltage zero-crossing detection circuit 40.

The ASIC 25A, 25B, 25C also includes logic for processing and sensing the load current supplied to the connected PSD 20A, 20B, 20C from the corresponding low VA transformer 10A, 10B, 10C. For example, the load current may be measured across a shunt resistor included in the PSD 20A, 20B, 20C. The AC load current waveform is then output to a current zero-crossing circuit 50.

Both the voltage zero-crossing circuit 40 and the current zero-crossing circuit 50 send their respective detection signals to a control circuit 60, which in turn is operably connected to control the PSD 20A, 20B, 20C. As shown in FIG. 6, the PSD 20A, 20B, 20C is operably connected to the corresponding load of the electrical phase.

An exemplary embodiment of the operation of the SSPC 100 is provided in the following description.

Each low VA transformer 10A, 10B, 10C is configured to isolate a phase voltage of the power source to a PSD 20A, 20B, 20C, which controls the corresponding phase of the load. The low VA transformer 10A, 10B, 10C is also operable to lower the voltage level of the phase to a suitable level for the digital circuitry in the ASIC 25A, 25B, 25C.

Each ASIC 25A, 25B, 25C includes a voltage zero-crossing detection circuit 40 that converts the AC line voltage waveform, which is output by the low VA transformer 10A, 10B, 10C, for the corresponding power phase. Specifically, the voltage zero-crossing detection circuit 40 converts the voltage waveform to a digital pulse waveform, e.g., as illustrated in FIG. 3. This digital pulse waveform is sent to the control device 60 to be used as a triggering signal to control the connected PSD 20A, 20B, 20C to switch-on the corresponding load phase.

Accordingly, when the power switching controller 30 receives a command signal (not shown) to switch the load on, the control device 60 is instructed to turn on its corresponding phase load. After receiving such an instruction, logic within the control device 60 waits for the next rising edge of the triggering signal to be received from voltage zero-crossing detection circuit 40. The control device 60 is triggered by this rising edge to control the connected PSD 20A, 20B, 20C to switch-on the phase of the load.

As discussed above, if the control device 60 fails to receive a rising edge in the digital pulse waveform within a predetermined time (e.g., one-half phase cycle) of the time at which the command signal is received, a fail-safe mechanism (not shown) in the ASIC 25A, 25B, 25C may automatically trigger the control device 60 to control the PSD 20A, 20B, 20C to turn on its respective load phase. Thus, a failure with respect to the voltage zero-crossing detection circuit(s) 40 will not disable the load equipment.

In a similar fashion, the control device 60 uses a digital pulse waveform received from the current zero-crossing detection circuit 50 to control the PSD 20A, 20B, 20C to turn off its respective phase load. Specifically, after a switch-off command signal (not shown) is received by the power switching controller 30, the control device 60 is instructed to switch-off a corresponding phase load. Thereafter, the control device is triggered by the next rising edge of the triggering signal from current zero-crossing circuit 50 to control the PSD 20A, 20B, 20C to switch the load off.

However, fail-safe logic (not shown) may be included within each ASIC 25A, 25B, and 25C to trigger the control device 60 to control the connected PSD 20A, 20B, 20C to switch the load phase off if the control device 60 does not receive a rising edge within a predetermined time (e.g., one-half cycle) after the switch-off command signal is received. Such a mechanism decreases the risk of overheating within a particular PSD 20A, 20B, 20C, whose light weight and small size make it susceptible to overcurrent conditions.

As shown in FIG. 6, the digital pulse waveforms of the voltage and current zero-crossing detection circuits 40 and 50, respectively, may be inverted before being sent to the control device 60. Thus, the control device 60 of ASIC 25C may be triggered to control the PSD 20C to switch-on or -off the third phase of the load at a zero-crossing point at which the third phase of the power source transitions from positive to negative, rather than from negative to positive. As illustrated in FIG. 5, this inverted zero-crossing detection signal allows each of the three phases of the electrical load to be turned on or off within one-half cycle of one another. Thus, each phase of the electrical load may be turned on and off at zero-crossing points when the above-described fail-safe logic is utilized.

According to the above-described operation, the ASICs 25A, 25B, and 25C of the power switching controller 30 are operable to turn each phase of a multiple-phase electrical load on at a zero-crossing point of supplied voltage, thus reducing noise and harmonics, as well as the effects of EMI, in the load. Further, the ASICs are operable to switch each phase of the load off at a zero-crossing point of the load current, thereby decreasing the adverse effects of thermal stress on the components and wiring of the electrical system.

Figure 7:
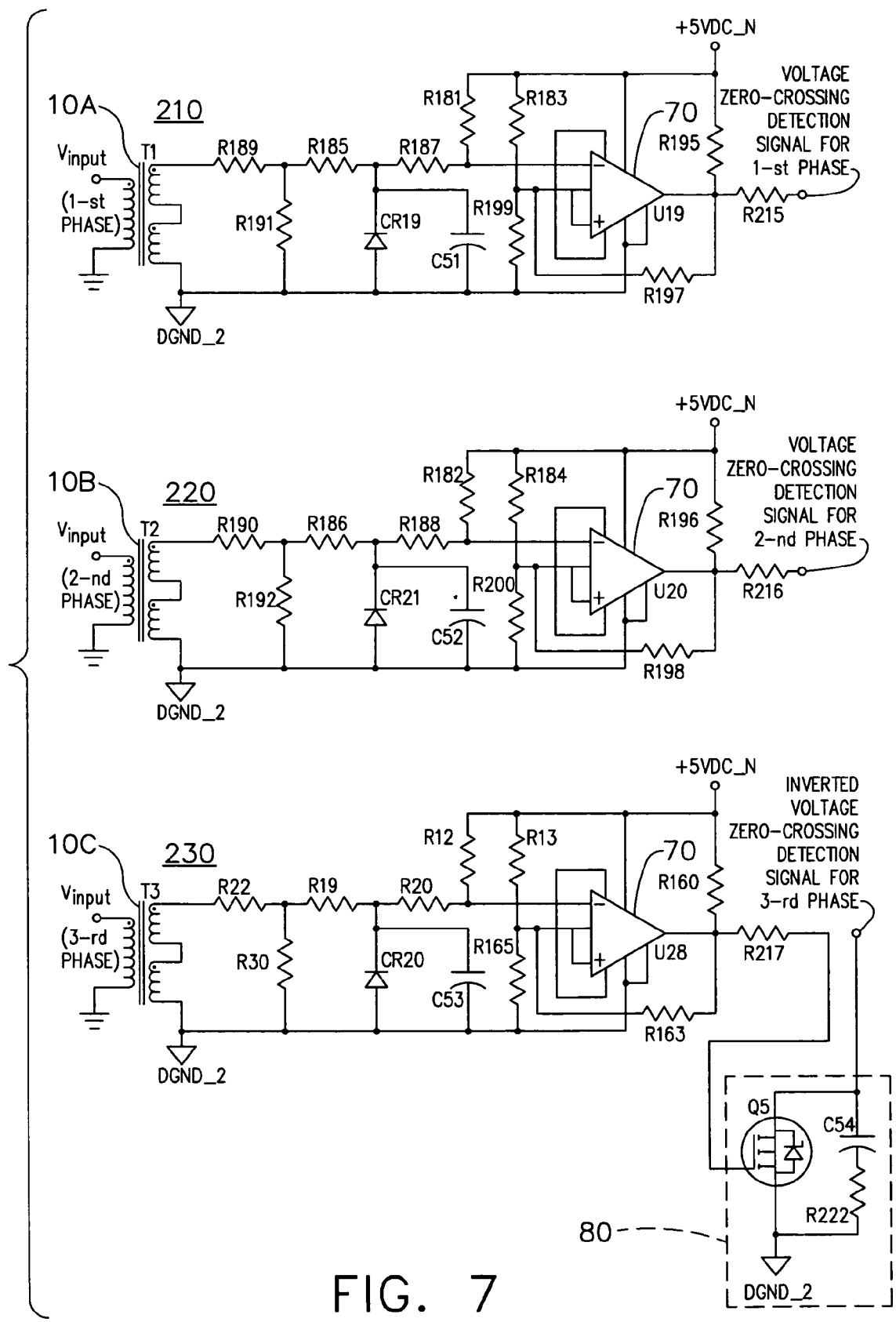
FIG. 7 illustrates a schematic diagram of the SSPC illustrated in FIG. 6, in accordance with an exemplary embodiment of the present invention.

FIG. 7 is a schematic diagram more specifically illustrating circuit components configured to implement line voltage isolation and voltage zero-crossing detection, according to an exemplary embodiment of the present invention. In particular, FIG. 7 illustrates circuits 210, 220, and 230 for generating the triggering signals corresponding to voltage zero-crossing detection for the first phase, second phase, and third phase, respectively.

In FIG. 7, each of the circuits (210, 220, and 230) includes a low VA transformer (10A, 10B, and 10C, respectively) for isolating the corresponding phase of the input voltage $V_{IN}$ put to voltage detection circuitry. The voltage detection circuitry of each circuit (210, 220, 230) is configured with a voltage comparator IC 70. Further, the circuit 230, which corresponds to the third phase, includes an inverting circuit 80 for providing an inverted zero-crossing detection signal. However, FIG. 7 illustrates an exemplary embodiment, and the present invention covers all circuit designs which are functionally equivalent or obvious variations.

According to an exemplary embodiment, the SSPC 100 may be implemented in an electrical power distribution system (EPDS), which includes one or more micro-controllers for issuing command signals to the SSPC 100 to turn the electrical load on or off. However, the power switching controller 30 of the SSPC 100 may also make its own determination to switch the load off based on monitoring and protective functions. Where the power switching controller 30 makes such a determination, it may generate its own command signal to instruct each ASIC 25A, 25B, 25C to switch its respective load phase on or off.

As described above, exemplary embodiments of the present invention may be utilized in an electrical power distribution system, such as the Electrical Load Management Center (ELMC) described in U.S. patent application Ser. No. 10/017,125 entitled "Electric Load Management Center," filed on Dec. 14, 2001, the entire contents of which are herein incorporated by reference. For example, the SSPC 100 of the present invention may be implemented in a Load Management Module (LMM) in the ELMC described in this application, as will be readily apparent to those of ordinary skill in the art.

What is claimed is:

1. A method for operating a solid state power control (SSPC) device to control a multiple-phase electrical load for a multiple-phase power source, comprising:
   triggering respective phases of the multiple-phase electrical load to switch on or off in such a manner that:
      each phase of the electrical load is triggered according to a zero-crossing point for a corresponding phase of the multiple-phase power source, and
      at least one of the phases of the electrical load is triggered according to a zero-crossing toward a positive amplitude of a corresponding phase of the power source, while another of the phases of the electrical load is triggered according to a zero-crossing toward a negative amplitude of a corresponding phase of the power source.

2. The method according to claim 1, further comprising:
   generating, for each voltage phase of the power source, a digital pulse waveform whose rising and falling edges occur at zero-crossing points for the voltage phase, wherein the triggering step uses at least one of the edges of each digital pulse waveform to trigger a corresponding phase of the electrical load to be switched-on.

3. The method according to claim 2, wherein the triggering step is performed in response to a switch-on command received by the SSPC device.

4. The method according to claim 3, wherein the triggering step causes each phase of the electrical load to be switched on within a predetermined time after a first one of the phases of the electrical load is switched on.

5. The method according to claim 4, wherein the predetermined time corresponds to ½ cycle of a phase of the electrical load.

6. The method according to claim 5, wherein
   the electrical load is a three-phase electrical load,
   the power source is a three-phase power source, and the generating step includes,
  generating a first, second and third digital pulse waveform for the first, second and third voltage phases of the power source, respectively;
  inverting the third digital pulse waveform, and
the triggering step includes;
  using the rising edge of the first and second digital pulse waveform to trigger a first and second phase of the electrical load, respectively, to be switched-on; and
  using the rising edge of the inverted third digital pulse waveform to trigger a third phase of the electrical load to be switched-on.

7. The method according to claim 3, further comprising:
  if the phase of the electrical load has not been triggered by a digital pulse waveform within a predetermined time after the switch-on command is received by the SSPC device, switching-on one of the phases of the electrical load at an arbitrary time,
  wherein the predetermined time is equal to at least ½ cycle of the phase of the electrical load.

8. The method according to claim 1, further comprising:
  generating, for each current phase of the power source, a digital pulse waveform whose rising and falling edges occur at zero-crossing points for the current phase, wherein the triggering step uses at least one of the edges of the digital pulse waveform to trigger a corresponding phase of the electrical load to be switched-off.

9. The method according to claim 8, wherein the triggering step is performed in response to a switch-off command received by the SSPC device.

10. The method according to claim 9, wherein
the electrical load is a three-phase electrical load,
the power source is a three-phase power source, and
the generating step includes,
  generating a first, second and third digital pulse waveform for the first, second and third current phase of the power source, respectively;
  inverting the third digital pulse waveform, and
the triggering step includes;
  using the rising edge of the first and second digital pulse waveform to trigger a first and second phase of the electrical load, respectively, to be switched-off; and
  using the rising edge of the inverted third digital pulse waveform to trigger a third phase of the electrical load to switched-off.

11. The method according to claim 9, further comprising:
  if the phase of the electrical load has not been triggered by a digital pulse waveform to be switched-off within a predetermined time after the switch-off command is received by the SSPC device, switching-off one of the phases of the electrical load at an arbitrary time,
  wherein the predetermined time is equal to at least ½ cycle of the phase of the electrical load.

12. A solid state power control (SSPC) device for controlling a multiple-phase electrical load of a multiple-phase power source, comprising:
  one or more power switching devices (PSDs) configured to trigger respective phases of the multiple-phase electrical load to switch on or off in such a manner that:
    each phase of the electrical load is triggered according to a zero-crossing point of a corresponding phase of the multiple-phase power source, and
    at least one of the phases of the electrical load is triggered according to a zero-crossing toward a positive amplitude of a corresponding phase of the power source, while another of the phases of the electrical load is triggered according to a zero-crossing toward a negative phase of a corresponding phase of the power source.

13. The SSPC device according to claim 12, further comprising:
  multiple PSDs corresponding to the multiple phases of the electrical load; and
  a power switching controller operably connected to the PSDs, wherein the power switching controller is configured to convert each phase of the power source to a triggering signal for controlling a corresponding one of the PSDs.

14. The SSPC device according to claim 13, wherein the power switching controller includes,
  one or more zero-crossing detection devices, each of which is configured to receive a waveform corresponding to a phase of the power source, and to convert the received waveform into a digital pulse waveform whose rising and falling edges occur at zero-crossing points for the received waveform.

15. The SSPC device according to claim 14, wherein the power switching controller further includes,
  multiple control devices, each of which is configured to receive the digital pulse waveform from an operably connected zero-crossing detection device as the triggering signal for a corresponding PSD, wherein the control device is triggered by a rising edge of the received triggering signal to control the PSD to switch the respective phase of the electrical load on or off.

16. The SSPC device according to claim 15, wherein each control device is configured to:
  receive a command signal, and
  be triggered by the rising edge of the triggering signal, which is received after the command signal, to control the corresponding PSD to switch the respective phase of the electrical load on or off.

17. The SSPC device according to claim 16, wherein
the electrical load is a three-phase electrical load and the power source is a three-phase power source,
the power switching controller includes
  a first, second and third zero-crossing detection devices configured to receive a waveform corresponding to a first, second and third phase of the power source, respectively, and to convert the received waveform into a first, second and third digital pulse waveforms, respectively, wherein the third digital pulse waveform is inverted; and
  first, second and third control devices operably connected to the first, second and third zero-crossing detection devices, respectively, wherein the third control device is triggered by a rising edge of the inverted third digital pulse waveform.

18. The SSPC device according to claim 16, wherein the power switching controller includes,
  fail-safe logic configured to trigger each of the control devices to control the corresponding PSD to switch the respective phase of the electrical load on or off at an arbitrary time, if the control device has not received a rising edge of the triggering signal within a predetermined time after the command signal, wherein the predetermined time is equal to at least ½ cycle of the respective phase of the electrical load.

19. The SSPC device according to claim 15, wherein the power switching controller includes an application specific integrated circuit (ASIC) operably connected to each PSD, wherein the ASIC includes the zero-crossing detection device and control device for controlling the PSD.

20. The SSPC device according to claim 15, wherein
at least one of the zero-crossing detection devices is a voltage zero-crossing detector configured to receive a waveform corresponding to a voltage phase of the power source, and to convert the received waveform into a digital pulse waveform, and
the control device, which is operably connected to the voltage zero-crossing detector, is triggered to control the corresponding PSD to switch-on the respective phase of the electrical load.

21. The SSPC device according to claim 15, wherein
at least one of the zero-crossing detection devices is a current zero-crossing detector configured to receive a waveform corresponding to a current phase of the power source, and to convert the received waveform into a digital pulse waveform, and
the control device, which is operably connected to the current zero-crossing detector, is triggered to control the corresponding PSD to switch-off the respective phase of the electrical load.

22. A solid state power control (SSPC) device for controlling a multiple-phase electrical load of a multiple-phase power source, comprising:
one or more power switching devices (PSDs), each of which is configured to switch a phase of the multiple-phase electrical load on or off at a zero-crossing point of a corresponding phase of the variable frequency multiple-phase power source;
a power switching controller operably connected to the PSDs, wherein the power switching controller is configured to convert each phase of the power source to a triggering signal for controlling a corresponding one of the PSDs,
wherein the power switching controller includes:
one or more zero-crossing detection devices, each of which is configured to receive a waveform corresponding to a phase of the power source, and to convert the received waveform into a digital pulse waveform whose rising and falling edges occur at zero-crossing points for the received waveform, and
one or more control devices, each of which is configured to receive the digital pulse waveform from an operably connected zero-crossing detection device as the triggering signal for a corresponding PSD, wherein the control device is triggered by a rising edge of the received triggering signal to control the PSD to switch the respective phase of the electrical load on or off, and
wherein at least one of the control devices is configured to receive, and be triggered by, an inverted digital pulse waveform of the operably connected zero-crossing detection device.

* * * * *